(12) United States Patent
Hirler et al.

(10) Patent No.: US 9,653,596 B2
(45) Date of Patent: May 16, 2017

(54) SUPERJUNCTION DEVICE AND SEMICONDUCTOR STRUCTURE COMPRISING THE SAME

(71) Applicant: Infineon Technologies Austria AG, Villach (AT)

(72) Inventors: Franz Hirler, Isen (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/097,932

(22) Filed: Apr. 13, 2016

(65) Prior Publication Data

US 2016/0225893 A1    Aug. 4, 2016

Related U.S. Application Data

(62) Division of application No. 14/524,193, filed on Oct. 27, 2014, now Pat. No. 9,368,617.

(30) Foreign Application Priority Data

Oct. 30, 2013  (CN) .................... 2013 2 0675262 U

(51) Int. Cl.
*H01L 29/78*         (2006.01)
*H01L 29/06*         (2006.01)
(Continued)

(52) U.S. Cl.
CPC ...... *H01L 29/7811* (2013.01); *H01L 29/0634* (2013.01); *H01L 29/0696* (2013.01);
(Continued)

(58) Field of Classification Search
CPC .................... H01L 29/0634; H01L 29/7813
(Continued)

(56) References Cited

U.S. PATENT DOCUMENTS 7,638,841 B2 * 12/2009 Challa ................. H01L 21/3065
                                                      257/331
8,373,225 B2 *  2/2013 Hsieh .................. H01L 29/0634
                                                      257/331
(Continued)

OTHER PUBLICATIONS

Notice of Allowance dated Feb. 12, 2016 for U.S. Appl. No. 14/524,193.
(Continued)

*Primary Examiner* — Moazzam Hossain
(74) *Attorney, Agent, or Firm* — Eschweiler & Potashnik, LLC

(57) ABSTRACT

The present disclosure relates to a superjunction device and a semiconductor structure having the same. The superjunction device includes a body region of a second conduction type, a drain region of a first conduction type, a drift region located between said body region and said drain region. The drift region includes first regions of a first conduction type and second regions of a second conduction type arranged alternately along a direction being perpendicular to the direction from the body region to the drain region, and a plurality of trench gate structures, each of them comprising a trench extending into said drift region from an upper surface of said body region and a gate electrode in said trench surrounded by a first dielectric layer filling said trench, and a source region of a first conduction type embedded into said body region. There is no source region along at least 10% of the total interface length between the first dielectric layer and the body region.

8 Claims, 4 Drawing Sheets

(51) Int. Cl.
  *H01L 29/10*   (2006.01)
  *H01L 29/40*   (2006.01)
  *H01L 29/423*   (2006.01)
  *H01L 29/08*    (2006.01)

(52) U.S. Cl.
  CPC ........ *H01L 29/1095* (2013.01); *H01L 29/404* (2013.01); *H01L 29/407* (2013.01); *H01L 29/7813* (2013.01); *H01L 29/0638* (2013.01); *H01L 29/0869* (2013.01); *H01L 29/42372* (2013.01)

(58) Field of Classification Search
  USPC .......................................................... 257/331
  See application file for complete search history.

(56) References Cited

U.S. PATENT DOCUMENTS

| | | |
|---|---|---|
| 2008/0164516 A1 | 7/2008 | Darwish |
| 2010/0044792 A1 | 2/2010 | Hebert |
| 2010/0308400 A1 | 12/2010 | Darwish |
| 2011/0204442 A1* | 8/2011 | Guan .................. H01L 29/0634 257/342 |
| 2014/0061783 A1* | 3/2014 | Xiao ..................... H01L 29/861 257/333 |

OTHER PUBLICATIONS

Non-Final Office Action dated Oct. 5, 2015 for U.S. Appl. No. 14/524,193.

\* cited by examiner

SUPERJUNCTION DEVICE AND SEMICONDUCTOR STRUCTURE COMPRISING THE SAME

CROSS REFERENCE TO RELATED APPLICATIONS

This application is a Divisional patent application claiming priority to U.S. patent application Ser. No. 14/524,193 filed on Oct. 27, 2014 in the name of Franz Hirler, et al. entitled "Superjunction Device and Semiconductor Structure Comprising the Same", which claims priority to Chinese Patent Application serial number 201320675262.9 filed Oct. 30, 2013 and is hereby incorporated in its entirety.

FIELD

The present disclosure relates to the field of semiconductor devices, and in particular, to a superjunction device with an optimized trench gate structure and a semiconductor structure comprising said superjunction device.

BACKGROUND

The use of superjunction devices is becoming more and more widespread in the recent years. In a conventional n-channel superjunction device, p columns and n columns that are arranged alternately combine to form a compound buffer layer, which is used to replace the n-type epitaxial layer in an MOSFET device. A typical p column in the compound buffer layer is surrounded by adjacent n columns, and a typical n column is surrounded by adjacent p columns.

Taking superjunction transistors as an example, superjunction transistors can reach very high switching speed and very low switching losses due to the fast depletion of n and p columns at drain-source voltages $V_{DS}$ 50V. This however can lead to increased ringing tendency which may result even in a destruction of the device. Therefore a very low gate drain capacitance $C_{GD}$ at high $V_{DS}$ should be avoided. Also an increase of gate source capacitance $C_{GS}$ may be desirable as this reduces the amplitude of the gate voltage $V_{GS}$ caused e.g. by feedback by inductive parasitic in the source connection or the raise of the drain voltage $V_{DS}$. This can help for example to avoid $dV_{DS}/dt$ induced turn on under normal application conditions. On the other hand, under extreme dV/dt and dI/dt conditions like commutation, $dV_{DS}/dt$ induced turn on may be desirable.

To optimize a device for all this different needs, especially for trench cells which tend to have a higher transconductance, it is important to choose optimized $C_{GD}/C_{GS}$ ratios as well as optimized absolute $C_{GD}$ and $C_{DS}$ values. Therefore, modification of the cell structure is required to tailor the device capacitances to the application requirements depending on $V_{DS}$.

For power transistors, especially super-junction transistors, the gate pad is typically arranged on a thick oxide (field oxide) with a typical thickness≥1 µm, or at least 500 nm. This has an advantage of higher bonding ruggedness for connecting the gate pad to a gate connection at the package with a wire bond. The capacitance depends on the size of the gate pad—and the area of additional metal lines distributing the gate potential on the chip like a gate runner or gate fingers—the oxide thickness as well as the doping under the gate pad. The capacitance of the gate pad can also help to optimize the device for the capacitance requirements optimizing the switching behavior.

SUMMARY

In one embodiment a power device is disclosed, especially a superjunction device, with an optimized trench gate structure as well as a semiconductor structure comprising said power device.

In one embodiment of the present disclosure, a superjunction device is provided, which comprises a drain region of a first conduction type, a body region of a second conduction type, and a drift region located between said body region and said drain region. The drift region comprises first regions of a first conduction type and second regions of a second conduction type arranged alternately along a direction being perpendicular to the direction from the body region to the drain region. The superjunction device further comprises a plurality of trench gate structures, each of them comprising a trench extending into said drift region from an upper surface of said body region and a gate electrode in said trench surrounded by a first dielectric layer filling said trench, and a source region of a first conduction type embedded into said body region. In one embodiment there is no source region along at least 10% of the total interface length between the first dielectric layer and the body region.

In some embodiments, there is no source region on at least one side of at least 25% of said plurality of trench gate structures.

In some embodiments, there is no source region on both sides of the at least 10% of said plurality of trench gate structures.

In some embodiments, there is no source region on the same side of one or more of said plurality of trench gate structures.

In some embodiments, the trench gate structures which have no source region on both sides thereof are located in the second region of the second conduction type in the drift region.

In some embodiments, said plurality of trench gate structures are all located in the first region of the first conduction type in the drift region.

In some embodiments, each first region of the first conduction type includes at least one of said trench gate structures.

In some embodiments, said one or more trench gate structures which do not have a source region on the same side thereof are located at junctions of first and second regions of said drift region, so that said one or more trench gate structures do not have a source region on the sides of the second regions of the drift region. In one embodiment the first gate dielectric layer located between a bottom of said gate electrode and a bottom of said trench has a thickness of greater than 150 nm, for example, greater than 300 nm.

In some embodiments, said first conduction type is n type and said second conduction type is p type, or said first conduction type is p type and said second conduction type is n type.

According to another embodiment of the present disclosure, a semiconductor structure is provided, which comprises a superjunction device as described above, a semiconductor region surrounding said superjunction device, and a second gate dielectric layer formed on said semiconductor region. Further, a gate runner is embedded into said second gate dielectric layer, and a field plate is embedded into said second gate dielectric layer. In one embodiment a thickness of the second dielectric layer between said field plate and the semiconductor region is greater than a thickness of the second dielectric layer between at least a part of said gate runner and the semiconductor region.

In some embodiments, at one end of said gate runner, at least a part of said gate runner is located in the trench in said semiconductor region and is surrounded by said second gate dielectric layer in the trench.

In some embodiments, said semiconductor structure further comprises a gate pad located on said second gate dielectric layer, said gate pad being in electrical communication with said gate runner.

In some embodiments, said field plate is short circuited to a drain electrode of said superjunction device to form a termination mechanism of said semiconductor structure.

In some embodiments, said semiconductor region comprises first regions of a first conduction type and second regions of a second conduction type arranged alternately along a direction of a width of said semiconductor region.

In some embodiments, a thickness of the second dielectric layer between another end of said gate runner and the semiconductor region is the same as a thickness of the second dielectric layer between said field plate and the semiconductor region.

In some embodiments, said second regions located in said semiconductor region and under said gate runner are connected to a source electrode of said superjunction device.

In some embodiments, the second dielectric layer between said at least a part of said gate runner and the semiconductor region has a thickness smaller than 150 nm.

By implementing the superjunction device according to the present disclosure, the gate-drain capacitance $C_{GD}$ and gate-source capacitance $C_{GS}$ of the superjunction device can be adjusted (increased or reduced) as desired. For example, when the trench gate structures in the device increase in number, the absolute values of the gate-drain capacitance $C_{GD}$ and gate-source capacitance $C_{GS}$ increase accordingly. Besides, when there is no source region on at least one side of at least 10% (for example, 25%) of the plurality of trench gate structures, the transconductance as well as the short circuit ruggedness of the device can be effectively limited. Moreover, if one or more trench gate structures which do not have a source region on the same side thereof are located at junctions of first and second regions of said drift region, namely, said trenches are located at vertical pn junctions of the device, the gate-drain capacitance $C_{GD}$ can be reduced and the gate-source capacitance $C_{GS}$ can be increased at a low source-drain voltage $V_{DS}$. In addition, when said one or more trench gate structures do not have a source region on the sides of the second regions of the drift region, ruggedness of the device can be improved. Furthermore, when the bottom layer oxide under the gate electrode in the trench is thicker (e.g. having a thickness of greater than 150 nm or even greater than 300 nm), the gate-drain capacitance $C_{GD}$ can be reduced so as to reduce drain feedback and increase the switching speed of the superjunction device.

In addition, by implementing the semiconductor structure according to the present disclosure, a thinner gate oxide layer (e.g. having a thickness of 150 nm) is employed under the gate pad and/or gate runner and/or gate finger of said semiconductor structure, and a thick gate oxide layer is employed under the field plate that is at a gate potential, so that the gate-drain capacitance $C_{GD}$ can also be increased to reduce the amplitude of the gate voltage $V_{GS}$ spikes.

In particular, for most of the gate pad regions, the gate oxide layer is typically thinner than 150 nm, a gate electrode made of, for example, polysilicon is deposited on the gate oxide layer in the trench (there may be an oxide step or oxide ramp close to the end of the gate pad increasing the oxide thickness from the gate oxide level to the field oxide level). The pad metallization above the gate electrode is connected to the gate electrode via at least one contact hole. If there is a p-region connected to source potential below the gate pad/runner, the source-drain capacitance $C_{DS}$ is increased, at least at low $V_{DS}$ (depends on the p-doping concentration).

One problem that may arise from the different portions is that a gate pad may have different capacitance contributions depending on the on-state resistance $R_{DS,on}$ of the superjunction transistors. Since the gate pad area normally will be set to the minimal dimensions needed for assembly of a superjunction transistor to minimize chip area and cost, the ratio of the gate pad area to a total chip area is a maximum for smaller transistor size, i.e. high $R_{DS,on}$. For a set of $R_{DS,on}$-ranges for the same base technology of super-junction transistors, it may be desirable that the smallest transistor chip has the same switching behavior as the biggest transistor to make it easier for the user to exchange the superjunction transistors to fulfill different current or power ratings. Thus it may be beneficial to set the area of the gate electrode and the trench depth for adjusting the switching behavior of the biggest super-junction transistor chip in a row, i.e. the transistor with the lowest $R_{DS,on}$, and to gradually reduce the thin oxide area under the gate electrode and/or increasing the oxide thickness at the bottom of the trenches as the superjunction transistor chips get smaller, i.e. having higher $R_{DS,on}$ values.

BRIEF DESCRIPTION OF THE DRAWINGS

These and other features and advantages of the present disclosure will be apparent from the following detailed description with reference to the accompanying drawings, in which.

DETAILED DESCRIPTION

Figure 1:
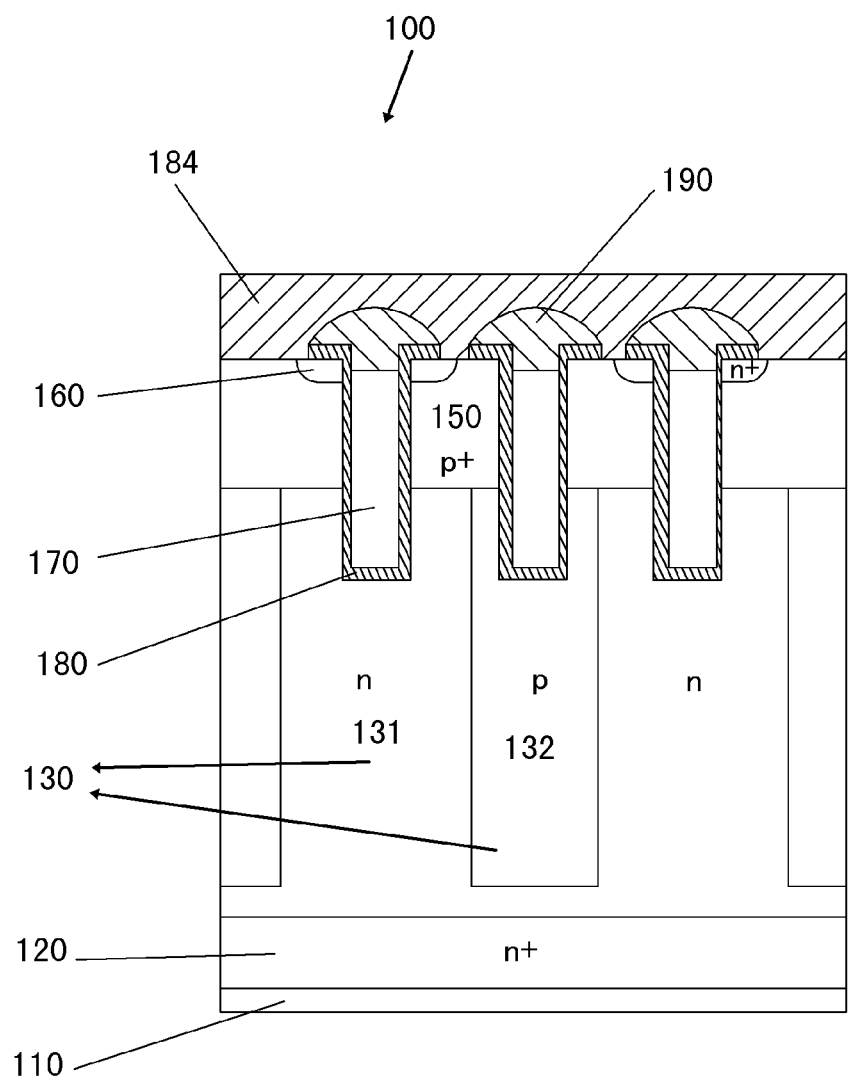
FIG. 1 schematically shows a cross-sectional view of a superjunction device according to an embodiment of the present disclosure.

Embodiments of the present disclosure now will be described more fully hereinafter with reference to the accompanying drawings, in which embodiments of the disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art. Like numbers refer to like elements throughout. Furthermore, the various layers and regions illustrated in the figures are illustrated schematically and are not necessarily drawn to scale. Accordingly, the present disclosure is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. Moreover, the terms "first conductivity type" and "second conductivity type" refer to opposite conductivity types such as N or P-type, however, each embodiment described and illustrated herein includes its complementary embodiment as well.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.)

The figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1 schematically shows a cross-sectional view of a superjunction device 100 according to an embodiment of the present disclosure.

In this embodiment, for the sake of convenience, the superjunction device 100 is described by taking an n-type device as an example. But the superjunction device 100 may also be a p-type device. In addition, in some embodiments, the superjunction device 100 may be a superjunction MOSFET.

The superjunction device 100 comprises an n-type drift region 130. An n+-doped drain region 120 is formed under the n-type drift region 130 through, for example, epitaxial growth. A p-type body region 150 and an n+-doped source region 160 are formed on the n-type drift region 130 in sequence. Moreover, the superjunction device 100 further comprises a plurality of trench gate structures, in which each trench is set to extend into the drift region 130 from the surface of the body region 150, and a bottom surface of said trench is located in the drift region 130. A gate electrode 170 is formed in each trench, and a space between the gate electrode 170 and the trench is filled up with an oxide layer 180. In other words, the oxide layer 180 surrounds the gate electrode 170 so as to isolate the gate electrode 170 from the walls of the trench. In one embodiment, said superjunction device 100 further comprises a source electrode 184 formed on the source region 160 so as to be in ohmic contact therewith and a drain electrode 110 formed under the drain region 120 so as to be in ohmic contact therewith. In this case, an oxide layer 190 is formed on the top of the gate electrode 170 so as to insulate the source electrode 184 from the gate electrode 170, as shown in FIG. 1. In one embodiment, both the gate electrode 170 and the source electrode 184 can be made of polysilicon or metal.

In this embodiment, the drift region 130 comprises a plurality of n regions 131 and p regions 132 arranged alternately along a direction of the width of the drift region, wherein at least the p regions are in contact with the p+ body region 150, and these n regions 131 and p regions 132 function as charge compensation regions. In this case, the p+ body region 150 is disposed between the source region 160 and the n regions 131 in the drift region 130. In one embodiment each of said n regions 131 and p regions 132 is of a column shape, as shown in FIG. 1.

The above-mentioned structure can be formed by means of the semiconductor process well known to those skilled in the art, which will not be described in detail any more.

In the embodiment shown in FIG. 1, one trench gate structure is included in each of the n region 131 and the p region 132 of the drift region 130. In this case, the number of the trench gate structures increase, so the absolute values of the gate-drain capacitance $C_{GD}$ and gate-source capacitance $C_{GS}$ can be increased. As the trench gate structures are located in the p region of the drift region 130, $C_{GS}$ increases at a higher factor than $C_{GD}$ improving the ratio $C_{GD}/C_{GS}$ improving thereby the re-turn-on immunity. Further, there is no source region 160 on both sides of the trench gate structure located in the p region of the drift region 130, but said source region 160 exists only on both sides of the trench gate structure located in the n region 131 of the drift region 130, as shown in FIG. 1. In this case, the transconductance of the device can be limited.

The present disclosure, however, is not limited to the embodiment shown in FIG. 1, the p region of the drift region 130 may include more than one trench gate structures. Furthermore, as an example, only one side of each trench gate structure in the p region of the drift region 130 does not have the source region. Alternatively, when the p region of the drift region 130 include more than two trench gate structures, it is possible that neither side of one trench gate structure has the source region, and only one side of another trench gate structure does not have the source region. In other embodiments a source region 160 is provided at one or both sides of the trench gate structure located in the p region 132 of the drift region 130.

In summary, the number of the trench gate structures in the p region of the drift region 130 and the side(s) of the trench gate structure that does not have the source region can be determined according to the desired switching characteristic and chip size of the superjunction device (e.g. superjunction transistor).

Figure 2:
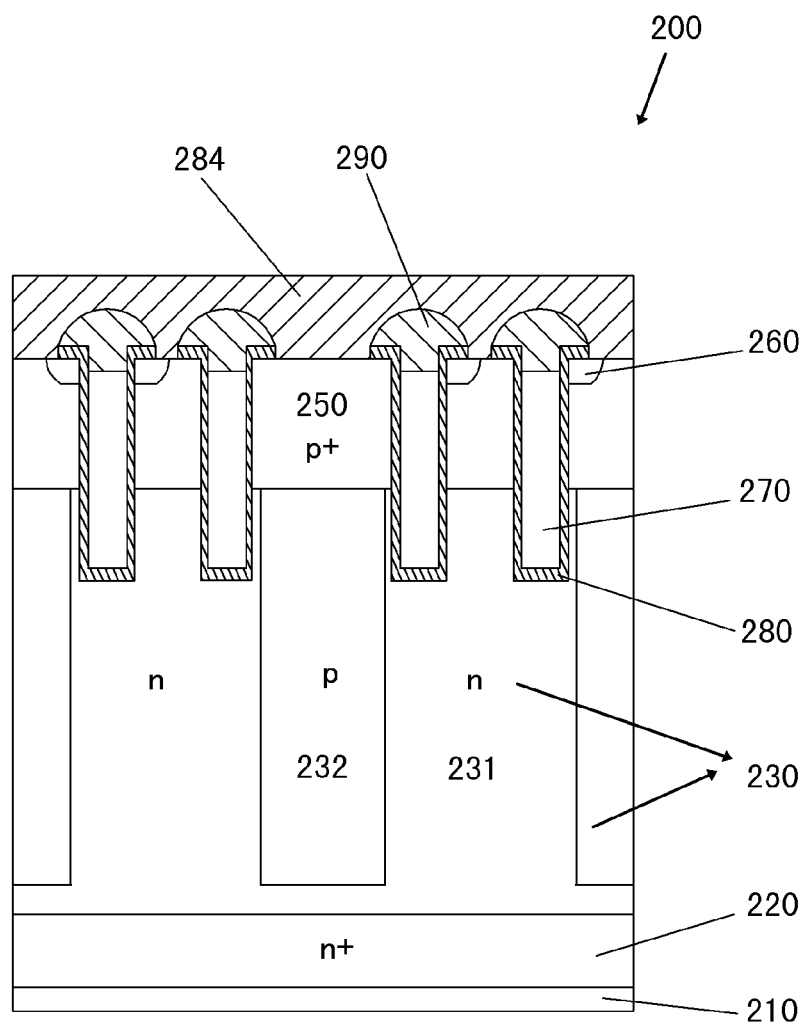
FIG. 2 schematically shows a cross-sectional view of a superjunction device according to another embodiment of the present disclosure.

FIG. 2 schematically shows a cross-sectional view of a superjunction device 200 according to another embodiment of the present disclosure.

Similar to the superjunction device 100 shown in FIG. 1, the superjunction device 200 comprises an n-type drift region 230. An n+-doped drain region 220 is formed under the n-type drift region 230 through, for example, epitaxial growth. A p-type body region 250 and an n+-doped source region 260 are formed on the n-type drift region 230 in sequence. Moreover, the superjunction device 200 further comprises a plurality of trench gate structures, in which each trench is set to extend into the drift region 230 from a surface of the body region 250, and a bottom surface of said trench is located in the drift region 230. A gate electrode 270 is formed in the trench, and a space between the gate electrode 270 and the trench is filled up with an oxide layer 280. In other words, the oxide layer 280 surrounds the gate electrode 270 so as to isolate the gate electrode 270 from the walls of the trench. In one embodiment, said superjunction device 200 further comprises a source electrode 284 formed on the source region 260 so as to be in ohmic contact therewith and a drain electrode 210 formed under the drain region 220 so as to be in ohmic contact therewith. In this case, an oxide layer 290 is formed on the top of the gate electrode 270 so as to insulate the source electrode 284 from the gate electrode 270, as shown in FIG. 2. In one embodiment, both the gate electrode 270 and the source electrode 284 can be made of polysilicon or metal.

In this embodiment, the drift region 230 comprises a plurality of n regions 231 and p regions 232 arranged alternately along a direction of the width of the drift region, wherein at least the p regions are in contact with the p+ body region 250, and these n regions 231 and p regions 232 function as charge compensation regions. In this case, the p+ body region 250 is disposed between the source region 260 and the n regions 231 in the drift region 230. In one embodiment each of said n regions 231 and p regions 232 is of a column shape, as shown in FIG. 2.

The above-mentioned structure can be formed by means of the semiconductor process well known to those skilled in the art, which will not be described in detail any more.

In the embodiment shown in FIG. 2, said plurality of trench gate structures are located in the n regions 231 of the drift region 230, while there is no trench gate structure in the p regions of the drift region 230. As an example FIG. 2 shows that the n regions 231 of the drift region 230 may include two trench gate structures. However, the present disclosure is not limited to this, and the n regions 231 of the drift region 230 may include more than two trench gate structures. In addition, in the embodiment shown in FIG. 2, one of the two trench gate structures in one n region 231 of the drift region 230 has source regions on both sides thereof, while the other trench gate structure does not have source regions on both sides thereof; as for the two trench gate structures in another n region 231 of the drift region 230, the source regions exist only on the same sides of each of the trench gate structures, and the source regions do not exist on the other sides of each of the trench gate structures. However, the present disclosure is not limited to this, and it can have such an arrangement as that one of the two trench gate structures in one n region 231 of the drift region 230 has source regions on both sides thereof, while the other trench gate structure have the source region only on one side thereof; as for the two trench gate structures in another n region 231 of the drift region 230, the source regions exist only on opposite sides of the two trench gate structures. This structure increases $C_{GD}$ at the same factor as $C_{GS}$ resulting in higher ringing immunity.

In summary, the number of the trench gate structures in the n region 231 of the drift region 230 and the side(s) of the trench gate structure that does not have the source region can be determined according to the desired switching characteristic and chip size of the superjunction device (e.g. superjunction transistor).

Figure 3:
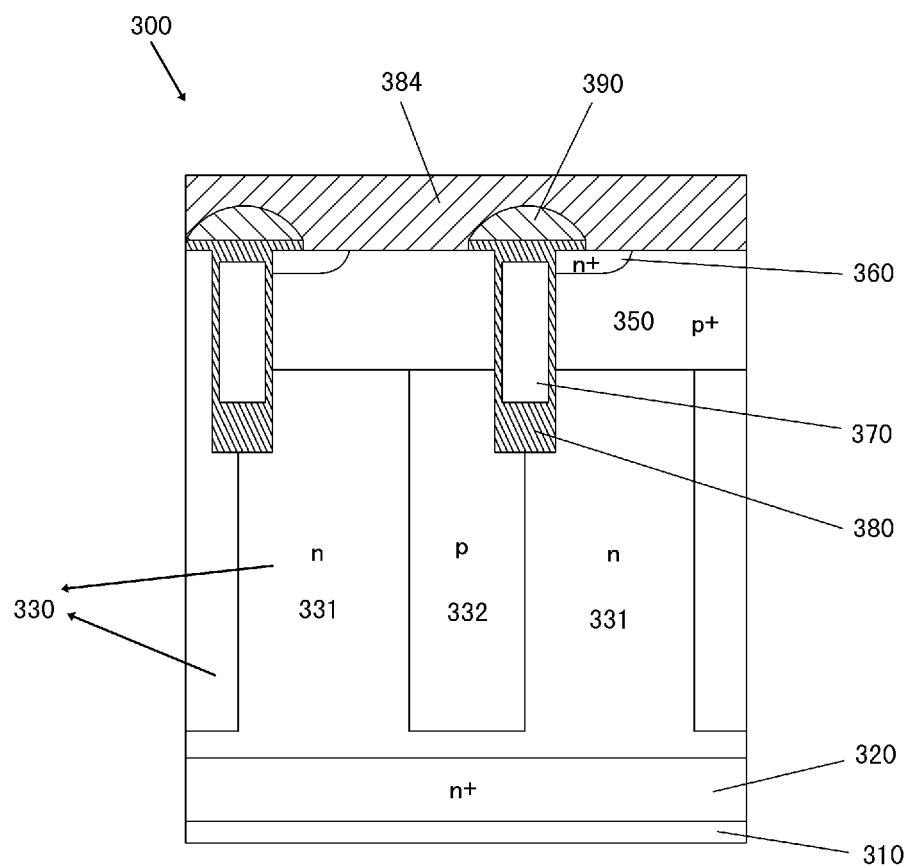
FIG. 3 schematically shows a cross-sectional view of a superjunction device according to still another embodiment of the present disclosure.

FIG. 3 schematically shows a cross-sectional view of a superjunction device 300 according to still another embodiment of the present disclosure.

Similar to the superjunction device 200 shown in FIG. 2, the superjunction device 300 comprises an n-type drift region 330. An n+-doped drain region 320 is formed under the n-type drift region 330 through, for example, epitaxial growth. A p-type body region 350 and an n+-doped source region 360 are formed on the n-type drift region 330 in sequence. Moreover, the superjunction device 300 further comprises a plurality of trench gate structures, in which each trench is set to extend into the drift region 330 from a surface of the body region 350, and a bottom surface of said trench is located in the drift region 330. A gate electrode 370 is formed in the trench, and a space between the gate electrode 370 and the trench is filled up with an oxide layer 380. In other words, the oxide layer 380 surrounds the gate electrode 370 so as to isolate the gate electrode 370 from the walls of the trench. In one embodiment, said superjunction device 300 further comprises a source electrode 384 formed on the source region 360 so as to be in ohmic contact therewith and a drain electrode 310 formed under the drain region 320 so as to be in ohmic contact therewith. In this case, an oxide layer 390 is formed on the top of the gate electrode 370 so as to insulate the source electrode 384 from the gate electrode 370, as shown in FIG. 3. In one embodiment, both the gate electrode 370 and the source electrode 384 can be made of polysilicon or metal or a stack thereof.

In this embodiment, the drift region 330 comprises a plurality of n regions 331 and p regions 332 arranged alternately along a direction of the width of the drift region, wherein at least the p regions are in contact with the p+ body region 350, and these n regions 331 and p regions 332 function as charge compensation regions. In this case, the p+ body region 350 is disposed between the source region 360 and the n regions 331 in the drift region 330. In one embodiment each of said n regions 331 and p regions 332 is of a column shape, as shown in FIG. 3.

The above-mentioned structure can be formed by means of the semiconductor process well known to those skilled in the art, which will not be described in detail any more.

In one embodiment shown in FIG. 3, the trench gate structure that does not have the source region 360 on one side thereof is shifted to the vertical pn junction of the device, i.e. at the junction of the n region 331 and p region 332 of the drift region 330, thus at a low source-drain voltage $V_{DS}$, the gate-drain capacitance $C_{GD}$ can be reduced and the gate-source capacitance $C_{GS}$ can be increased. In addition, in the embodiment shown in FIG. 3, on the side of trench gate structure that is located in the p region of the drift region 330, the source region is omitted, thus ruggedness of the superjunction device can be improved.

Furthermore, in another embodiment shown in FIG. 3, the oxide layer between the gate electrode 370 and the trench bottom has a thickness of greater than 150 nm or even greater than 300 nm. In this case, since the oxide layer under the gate electrode in the trench is thicker, the gate-drain capacitance $C_{GD}$ can be reduced, as a result, the drain feedback can be reduced and the switching speed of the superjunction device can be increased. In addition or alternatively a further reduction of $C_{GD}$ can be achieved by choosing the gate oxide layer 280 thicker on one side wall of the trench (as shown in the figure).

Figure 4:
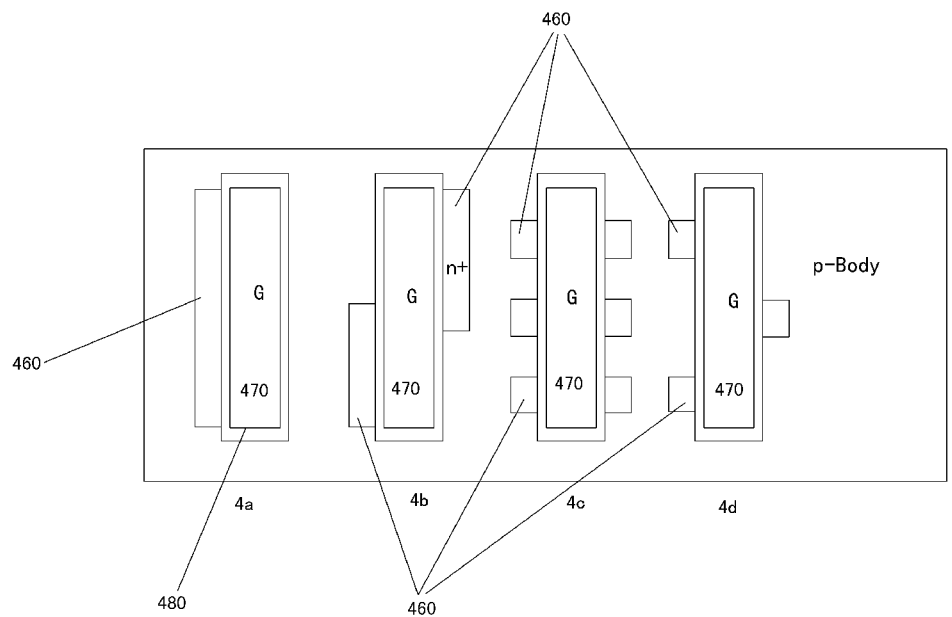
FIG. 4 schematically shows a perspective top view of a superjunction device according to an embodiment of the present disclosure.

FIG. 4 schematically shows a perspective top view of a superjunction device according to an embodiment of the present disclosure.

In particular, the perspective top view as shown in FIG. 4 is obtained as cut below silicon surface of the device, which is perpendicular to the cross-sectional views as shown in FIGS. 1-3.

It can be seen from the embodiments as illustrated by FIGS. 1-3 that the source region may exist on one or two sides of the trench gate structure, but there is no source region in at least certain regions along the circumference of the trench gate structure. According to the embodiments of the present disclosure, if assuming that the total interface length between the gate oxide and the body region is L, there is no source region along at least 10% of the interface length L.

FIG. 4 exemplarily shows several examples of the distribution of the source region along the trench gate structure. It can be seen from FIG. 4 that the source regions 460 may be present on only one side of the trench gate structure (that includes a gate electrode 470 and gate oxide 480 therein) (FIG. 4, first structure on left). The source regions 460 may be present on two side of the trench gate structure (that includes a gate electrode 470 and gate oxide 480 therein) with not occupying the whole length on each side (FIG. 4, second structure starting from the left). The source regions 460 may be present on two side of the trench gate structure (that includes a gate electrode 470 and gate oxide 480 therein), and are divided into several sections (FIG. 4, third and fourth structures starting from the left).

Nevertheless, the embodiments as shown in FIGS. 1-4 are only illustrative and do not exhaustively illustrate the implementations of the present disclosure, thus not limiting the present disclosure.

Figure 5:
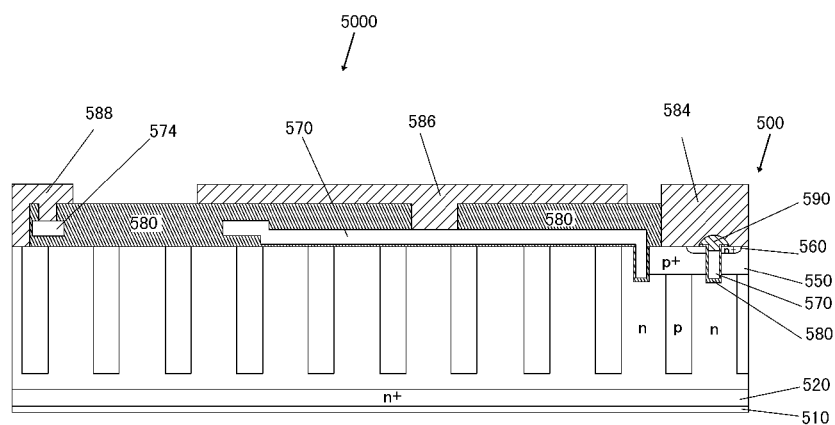
FIG. 5 schematically shows a cross-sectional view of a semiconductor structure comprising a superjunction device according to an embodiment of the present disclosure.

FIG. 5 schematically shows a cross-sectional view of a semiconductor structure 5000 comprising a superjunction device according to an embodiment of the present disclosure.

It shall be note that the superjunction device 500 in FIG. 5 has the same structure as the superjunction device shown in FIG. 1, FIG. 2 or FIG. 3, so in order to better highlight this aspect of the present disclosure, descriptions of the superjunction device 500 will be omitted. But to facilitate reading of those skilled in the art, elements corresponding to those in FIG. 1, FIG. 2 or FIG. 3 are still denoted by similar reference numerals.

In FIG. 5, only one superjunction device 500 is shown as an example; but in fact, the semiconductor structure 5000 may comprise a plurality of superjunction devices or superjunction cells 500 which form the active cell region of the superjunction devices 5000.

As shown in FIG. 5, the semiconductor structure 5000 further comprises a semiconductor region surrounding a plurality of superjunction devices, on which an oxide layer 580 is formed. A gate runner 570 is embedded into the oxide layer 580, wherein at an end of the gate runner 570, at least a part of the gate runner 570 is located in the trench formed in said semiconductor region, and said at least a part of the gate runner 570 is surrounded by an oxide layer in said trench, so that it is insulated from the walls of the trench.

In one embodiment, the semiconductor structure 5000 further comprises a gate pad 586 formed on the oxide layer 580, said gate pad 586 is electrically connected to said gate runner 570 through at least one via hole.

Further, the semiconductor structure 5000 further comprises a field plate 574 embedded into the oxide layer 580. In one embodiment, said field plate 574 is short circuited to a drain electrode 588 of the superjunction device 500 (or of the semiconductor structure 5000) to form a termination mechanism of the semiconductor structure 5000.

In one embodiment, like in the drift region, the semiconductor region also comprises a plurality of n regions and p regions arranged alternately along a direction of a width of the semiconductor region. In one embodiment each of said n regions and p regions is of a column shape, as shown in FIG. 5. In one embodiment, the p regions located in the semiconductor region and under the gate runner 570 can be connected on via a further p region to a source electrode of said superjunction device 500. The p and r regions may also be omitted in the termination regions and only be present in the cell region.

In one embodiment shown in FIG. 5, the thickness of the oxide layer 580 under the field plate 574 is greater than the thickness of the oxide layer 580 under at least a part of the gate runner 570. In one embodiment the thickness of the oxide layer 580 under another end of the gate runner 570 is the same as the thickness of the oxide layer under the field plate 574, so that said another end of the gate runner 570 has an oxide step or oxide ramp. In one embodiment the thickness of the oxide layer under said at least a part of the gate runner 570 is smaller than 150 nm.

In some embodiments of the present disclosure, by implementing the semiconductor structure shown in FIG. 5, a thin oxide layer (e.g. having a thickness of 150 nm or less) is employed under the gate runner of said semiconductor structure, and a thick oxide layer is employed under the field plate at a gate potential, so that the gate-drain capacitance $C_{GD}$ can be increased and the amplitude of the gate voltage $V_{GS}$ spikes can be reduced.

In the above descriptions about FIGS. 1-5, in order to better highlight the present disclosure, only improved structures made in this disclosure are described in detail, while some semiconductor device structures known to those skilled in the art are only briefed or even omitted. In addition, the semiconductor device structure in the present disclosure can be formed by means of the semiconductor process well known to those skilled in the art, which will not be described in detail any more.

While the present disclosure and advantages thereof have been described in details by way of the exemplary embodiments, those skilled in the art shall understand that many substitutions and variations may be made to the present disclosure without departing from the spirit and scope of the present disclosure defined by the appended claims.

What is claimed is:

1. A semiconductor structure, which comprises:
 a superjunction device, comprising:
  a drain region of a first conduction type;
  a body region of a second conduction type;
  a drift region located between said body region and said drain region, the drift region comprises first regions of a first conduction type and second regions of a second conduction type arranged alternately along a direction being perpendicular to the direction from the body region to the drain region;
  a plurality of trench gate structures, each of them comprising a trench extending into said drift region from an upper surface of said body region and a gate electrode in said trench surrounded by a first dielectric layer filling said trench; and
  a source region of a first conduction type embedded into said body region;
  wherein there is no source region along at least 10% of the total interface length between the first dielectric layer and the body region;
 a semiconductor region surrounding said superjunction device and a second dielectric layer formed on said semiconductor region;
 a gate runner embedded into said second dielectric layer; and
 a field plate embedded into said second dielectric layer, wherein a thickness of the second dielectric layer between said field plate and the semiconductor region is greater than a thickness of the second dielectric layer between at least a part of said gate runner and the semiconductor region.

2. The semiconductor structure according to claim 1, wherein at one end of said gate runner, at least a part of said gate runner is located in the trench in said semiconductor region and is surrounded by said second dielectric layer in the trench.

3. The semiconductor structure according to claim 1, wherein said semiconductor structure further comprises a gate pad located on said second dielectric layer, said gate pad being in electrical communication with said gate runner.

4. The semiconductor structure according to claim 1, wherein said field plate is short circuited to a drain electrode of said superjunction device to form a termination mechanism of said semiconductor structure.

5. The semiconductor structure according to claim 1, wherein said semiconductor region comprises first regions of a first conduction type and second regions of a second conduction type arranged alternately along a direction of a width of said semiconductor region.

6. The semiconductor structure according to claim 2, wherein a thickness of the second dielectric layer between another end of said gate runner and the semiconductor region is the same as a thickness of the second dielectric layer between said field plate and the semiconductor region.

7. The semiconductor structure according to claim 5, wherein said second regions located in said semiconductor region and under said gate runner are electrically connected to a source electrode of said superjunction device.

8. The semiconductor structure according to claim 1, wherein the second dielectric layer between said at least a part of said gate runner and the semiconductor region has a thickness smaller than 150 nm.

* * * * *